(12) United States Patent
Sugo et al.

(10) Patent No.: US 11,551,985 B2
(45) Date of Patent: Jan. 10, 2023

(54) SEMICONDUCTOR DEVICE HAVING A RESIN LAYER SEALING A PLURALITY OF SEMICONDUCTOR CHIPS STACKED ON FIRST SEMICONDUCTOR CHIPS

(71) Applicant: Kioxia Corporation, Tokyo (JP)

(72) Inventors: Yuki Sugo, Yokkaichi (JP); Ayana Amano, Nagoya (JP); Keiichiro Hattori, Yokkaichi (JP); Takeshi Watanabe, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 141 days.

(21) Appl. No.: 17/010,926

(22) Filed: Sep. 3, 2020

(65) Prior Publication Data
US 2021/0280480 A1 Sep. 9, 2021

(30) Foreign Application Priority Data
Mar. 9, 2020 (JP) .............................. JP2020-039951

(51) Int. Cl.
*H01L 23/14* (2006.01)
*H01L 25/065* (2006.01)
*H01L 23/31* (2006.01)
*H01L 23/495* (2006.01)

(52) U.S. Cl.
CPC .............. *H01L 23/14* (2013.01); *H01L 23/31* (2013.01); *H01L 23/49531* (2013.01); *H01L 25/0657* (2013.01)

(58) Field of Classification Search
CPC ..................................................... H01L 23/14
USPC ........................................................ 257/777
See application file for complete search history.

(56) References Cited

U.S. PATENT DOCUMENTS

| 5,659,004 | A | * | 8/1997 | Takigawa | ............. | C08G 59/245 |
|---|---|---|---|---|---|---|
| | | | | | | 525/484 |
| 8,896,111 | B2 | | 11/2014 | Tanimoto et al. | | |
| 10,297,571 | B2 | | 5/2019 | Ozawa | | |
| 2006/0001156 | A1 | | 1/2006 | Wakiyama et al. | | |
| 2010/0311227 | A1 | * | 12/2010 | Hatakeyama | ........... | H01L 24/29 |
| | | | | | | 438/464 |
| 2012/0126404 | A1 | | 5/2012 | Wakiyama et al. | | |
| 2012/0248628 | A1 | | 10/2012 | Tanaka et al. | | |
| 2014/0070428 | A1 | * | 3/2014 | Tanimoto | ............. | H01L 23/488 |
| | | | | | | 257/777 |

FOREIGN PATENT DOCUMENTS

| JP | 2007-324443 A | 12/2007 |
|---|---|---|
| JP | 2018-41966 A | 3/2018 |
| TW | 200605280 A | 2/2006 |
| WO | WO 2008/020543 A1 | 2/2008 |
| WO | WO 2019/230697 A1 | 12/2019 |

* cited by examiner

*Primary Examiner* — Ajay Arora
(74) *Attorney, Agent, or Firm* — Oblon, McClelland, Maier & Neustadt, L.L.P.

(57) ABSTRACT

A semiconductor device of an embodiment includes: a wiring board; a semiconductor chip mounted on the wiring board; and a resin-containing layer bonded on the wiring board so as to fix the semiconductor chip to the wiring board. The resin-containing layer contains a resin-containing material having a breaking strength of 15 MPa or more at 125° C.

8 Claims, 5 Drawing Sheets

SEMICONDUCTOR DEVICE HAVING A RESIN LAYER SEALING A PLURALITY OF SEMICONDUCTOR CHIPS STACKED ON FIRST SEMICONDUCTOR CHIPS

CROSS REFERENCE TO RELATED APPLICATION

This application is based upon and claims the benefit of priority from Japanese Patent Application No. 2020-039951, filed on Mar. 9, 2020; the entire contents of which are incorporated herein by reference.

FIELD

Embodiments disclosed herein relate to a semiconductor device.

BACKGROUND

In order to achieve miniaturization, speed-up, high functionality, and the like of a semiconductor device, a semiconductor package of a semiconductor memory device having a structure in which a plurality of semiconductor chips are stacked and sealed in one package has been put to practical use. The semiconductor memory device includes the structure in which a FOD (Film On Device) material is bonded on a wiring board while a controller chip being embedded in the FOD material and memory chips are stacked in multistage on the FOD material, for example. In the semiconductor device constituting such a semiconductor memory device, the stack number of memory chips is increased, and the memory chips are stacked with the number of stages such as 16 stages, 24 stages, or 32 stages. The semiconductor device having the semiconductor chips stacked in multistage is required to suppress a crack of an adhesive layer such as the FOD material because there is a possibility that the crack occurs in the FOD material bonded to the wiring board, board wiring undergoes rupture, and defects are caused thereto.

DETAILED DESCRIPTION

A semiconductor device of an embodiment includes: a wiring board; a semiconductor chip mounted on the wiring board; and a resin-containing layer bonded on the wiring board so as to fix the semiconductor chip to the wiring board, wherein the resin-containing layer contains a resin-containing material having a breaking strength of 15 MPa or more at 125° C.

Hereinafter, there will be explained semiconductor devices of embodiments with reference to the drawings. Note that in each embodiment, substantially the same constituent parts are denoted by the same reference signs, and an explanation thereof will partly omitted in some cases. The drawings are schematic, and a relation of thickness and planer dimension, a thickness ratio among parts, and so on are sometimes different from actual ones. Terms indicating directions such as up and down in the explanation indicate relative directions in a case where a semiconductor chip mounting surface of a later-described board is defined as an upper side, unless otherwise noted, and there are some cases different from that of actual directions based on a gravitational acceleration direction.

First Embodiment

Figure 1:
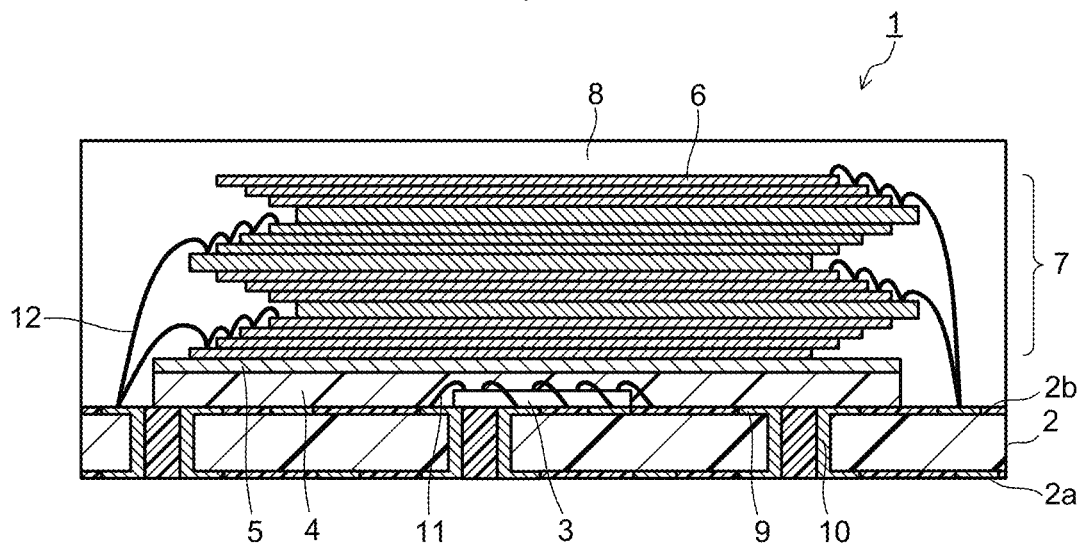
FIG. 1 is a sectional view illustrating a semiconductor device according to a first embodiment.

FIG. 1 is a sectional view illustrating a semiconductor device according to a first embodiment. A semiconductor device 1 illustrated in FIG. 1 includes a wiring board 2, a first semiconductor chip 3 mounted on the wiring board 2, a resin-containing layer (FOD) 4 which fixes the first semiconductor chip 3 to the wiring board 2 while embedding it, a spacer chip 5 made of a silicon or a resin and mounted on the resin-containing layer 4, a stack 7 of a plurality of second semiconductor chips 6 mounted on the spacer chip 5, and a sealing resin layer 8 provided on the wiring board 2 so as to seal the first semiconductor chip 3, the stack 7 of the second semiconductor chips 6, and the like.

The wiring board 2 has a wiring network constituted of wiring layers 9 provided on a surface of, for example, an insulating resin substrate, an insulating ceramic substrate, or the like and wiring layers 10 provided in the interior thereof, and so on, and concretely, there can be cited a printed wiring board using an insulating resin such as a glass-epoxy resin, or the like. The wiring layers 9, 10 are composed of a metallic material such as copper or a copper alloy, or, gold or a gold alloy. The wiring board 2 has a first face 2a serving as a forming surface of an external terminal, or the like and a second face 2b serving as a mounting surface of the semiconductor chips 3, 6.

On the second face 2b of the wiring board 2, the first semiconductor chip 3 is mounted, and the first semiconductor chip 3 is mounded to a chip mounting area of the wiring board 2 while being embedded in the resin-containing layer 4. The first semiconductor chip 3 has a thickness of about 40 μm, and the resin-containing layer 4 has a thickness of about 80 to 150 μm and depending on circumstances, a thickness of about 40 to 150 μm. The resin-containing layer 4 embedded with the first semiconductor chip 3 contains a resin-containing material having a breaking strength of 15 MPa or more at 125° C. as described in detail later. The resin-containing material (cured resin-containing material) composing the resin-containing layer 4 means a cured product of a resin composition used for formation of the resin-containing layer 4. As the first semiconductor chip 3, for example, there can be cited a system LSI chip such as a controller chip, an interface chip, a logic chip, or an RF chip which transmits and receives digital signals between semiconductor memory chips used as the second semiconductor chips 6 and an external device, but there is no limitation to these.

Figure 2:
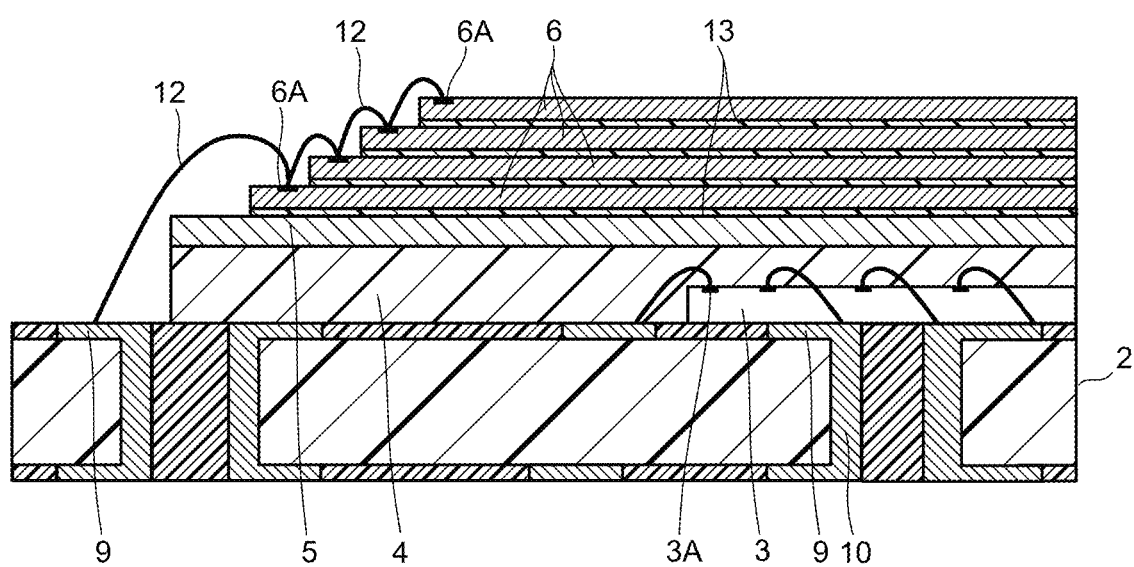
FIG. 2 is a sectional view enlarging and illustrating a part of the semiconductor device illustrated in FIG. 1.

FIG. 2 is a sectional view enlarging and illustrating a part of the semiconductor device illustrated in FIG. 1. As illustrated in FIG. 2, the first semiconductor chip 3 has electrodes 3A, and these electrodes 3A are electrically connected to the wiring layers 9 of the wiring board 2 via bonding wires 11. Directly mounting the first semiconductor chip 3 such as the controller chip on the wiring board 2 makes it possible to shorten a wiring length between the first semiconductor chip 3 and the wiring board 2. This improves a signal transfer rate between the first semiconductor chip 3 and the wiring board 2, or the like, resulting in allowing a speed-up response of the semiconductor device 1. Moreover, since the first semiconductor chip 3 is embedded in the resin-containing layer 4, there is neither reduction in mountability of the second semiconductor chips 6 with respect to the wiring board 2 nor prevention of miniaturization of a package size, or the like. Accordingly, it becomes possible to provide the semiconductor device 1 whose size is reduced and which corresponds to a high-speed device.

An outer shape of the first semiconductor chip 3 such as the controller chip is generally smaller than that of the second semiconductor chip 6 such as the semiconductor memory chip. Thus, after embedding the first semiconductor chip 3 mounted on the wiring board 2 in the resin-containing layer 4, the plurality of second semiconductor chips 6 are stacked and mounted on the resin-containing layer 4. As a concrete example of the second semiconductor chip 6, a semiconductor memory chip such as a NAND-type flash memory can be cited, but there is no limitation to this. In the first embodiment, 16 semiconductor memory chips are stacked and mounted as the second semiconductor chips 6. Note that the stack number of second semiconductor chips 6 is not limited to 16 stages, and may be 24 stages, 32 stages, or the like.

As illustrated in FIG. 2, the plurality (for example, 16 pieces or more) of second semiconductor chips 6 each have an electrode 6A arranged along one end portion. Among the plurality of second semiconductor chips 6 mounted on the resin-containing layer 4, the second semiconductor chips 6 from a first stage to a fourth stage are stacked in a staircase shape by sliding the end portions arranged with the electrodes 6A in a first direction (in the drawing, paper right direction) so as to expose the respective electrodes 6A, to constitute a first stack portion. The second semiconductor chips 6 from a fifth stage to an eighth stage are stacked in a staircase shape by sliding the end portions arranged with the electrodes 6A in a second direction (in the drawing, paper left direction) of the opposite direction to the first direction so as to expose the respective electrodes 6A, to constitute a second stack portion. The second semiconductor chips 6 from a ninth stage to a twelfth stage are stacked in a staircase shape by sliding the end portions arranged with the electrodes 6A in the first direction so as to expose the respective electrodes 6A, to constitute a third stack portion. The second semiconductor chips 6 from a thirteenth stage to a sixteenth stage are stacked in a staircase shape by sliding the end portions arranged with the electrodes 6A in the second direction so as to expose the respective electrodes 6A, to constitute a fourth stack portion.

As illustrated in FIG. 2, the spacer chip 5 is fixed on the resin-containing layer 4. Among the plurality of second semiconductor chips 6, the second semiconductor chip 6 at the first stage is fixed on the spacer chip 5 with an adhesion layer 13 interposed therebetween. For the adhesion layer 13, an adhesive such as a typical DAF (Die Attach Film) is used. The second semiconductor chips 6 except the one at the first stage are fixed to the second semiconductor chips 6 located on the lower sides by the adhesion layers 13 such as the DAF as illustrated in FIG. 2. It may be bonded between the wiring board 2 and the first semiconductor chip 3 by an adhesion layer (not illustrated) made of the DAF. The electrodes 6A of the second semiconductor chips 6 are electrically connected to the wiring layers 9 of the wiring board 2 via the bonding wires 12. Regarding the electrodes 6A having equal electric property and signal property, it is possible to connect the wiring layers 9 of the wiring board 2 and the electrodes 6A of the plurality of second semiconductor chips 6 in order by the bonding wires 12. The electrodes 6A of the second semiconductor chips 6 from the first stage to the fourth stage are connected in order by the bonding wires 12, and the electrode 6A of the second semiconductor chip 6 at the first stage and the wiring layer 9 of the wiring board 2 are connected by the bonding wire 12. The second semiconductor chips 6 at the fifth to eighth stages, the second semiconductor chips 6 at the ninth to twelfth stages, and the second semiconductor chips 6 at the thirteenth to sixteenth stages are also similar.

Among the plurality of second semiconductor chips 6, in the second semiconductor chips 6 at the fifth stage, the ninth stage, and the thirteenth stage, the end portions arranged with the electrodes 6A each to be subjected to wire bonding are protruded further than the second semiconductor chips 6 located on the lower sides at the respective stages. For this reason, a thickness of the second semiconductor chips 6 at the fifth stage, the ninth stage, and the thirteenth stage is set to be larger than the second semiconductor chips 6 except them so that the force applied at the time of wire bonding does not cause a crack, a fracture, or the like. For example, the second semiconductor chips 6 at the fifth stage, the ninth stage, and the thirteen stage each have a thickness of about 55 μm. The second semiconductor chips 6 except them each have a thickness of, for example, about 36 μm in order to reduce a thickness of the stack 7 and a thickness of the semiconductor device 1 based thereon and achieve thinning of the semiconductor device 1.

On the second face 2b of the wiring board 2, so as to seal the first semiconductor chip 3 and the stack 7 of the second semiconductor chips 6 together with the bonding wires 11, 12, and the like, the sealing resin layer 8 using an insulating resin such as an epoxy resin is, for example, mold-formed. The semiconductor device 1 of the first embodiment is constituted by these components. In such a semiconductor device 1, the first and second semiconductor chips 3, 6 each have a linear expansion coefficient of, for example, about 3 ppm. The wiring board 2 has a linear expansion coefficient of, for example, about 20 ppm. The sealing resin layer 8 has a linear expansion coefficient of, for example, about 10 ppm. The resin-containing material composing the resin-containing layer 4 has a linear expansion coefficient of, for example, 70 ppm or less. The semiconductor device 1 has a thickness of, for example, about 1.3 mm.

In addition to a difference in linear expansion coefficient between such constituent materials of the semiconductor device 1 as described above, with an increase in the stack number of second semiconductor chips 6, there is a fear of reduction in resistance of the semiconductor device 1 to a thermal cycle test (TCT). That is, due to the linear expansion coefficient difference between the wiring board 2 and the stack 7 of the second semiconductor chips 6, or the like, a stress caused by a temperature difference in the TCT makes a crack likely to occur in the resin-containing layer 4 embedded with the first semiconductor chip 3. The stack number of second semiconductor chips 6 is increased, and the larger a total thickness of the second semiconductor chips 6 is, the more likely the crack is to occur in the resin-containing layer 4. The stress concentrates at a tip of the crack which has occurred in the resin-containing layer 4, which causes rupture (wire break) in the wiring layer 9 coming into contact with the crack, resulting in causing defects.

In order to suppress the crack in the resin-containing layer 4 and the rupture (wire break) in the wiring layer 9 caused by the crack, in the semiconductor device 1 of the first embodiment, the resin-containing layer 4 is composed of the resin-containing material having the breaking strength of 15 MPa or more at 125° C. In the TCT for the semiconductor device 1, a thermal cycle such as, for example, −55° C.×15 minutes+125° C.×15 minutes is set to one cycle, and reliability of the semiconductor device 1 is evaluated by application of such a thermal cycle in, for example, 700 cycles, and further, 1000 cycles. In such a TCT for the semiconductor device 1, the resin-containing layer 4 is composed of the resin-containing material having the breaking strength of 15 MPa or more at 125° C., thereby making it possible to suppress the occurrence of the crack to the resin-containing layer 4 based on the stress caused by the temperature difference, and further, the occurrence of the rupture (wire break) in the wiring layer 9 due to the stress concentration at the tip of the crack. That is, it becomes possible to enhance the reliability of the semiconductor device 1.

Figure 3:
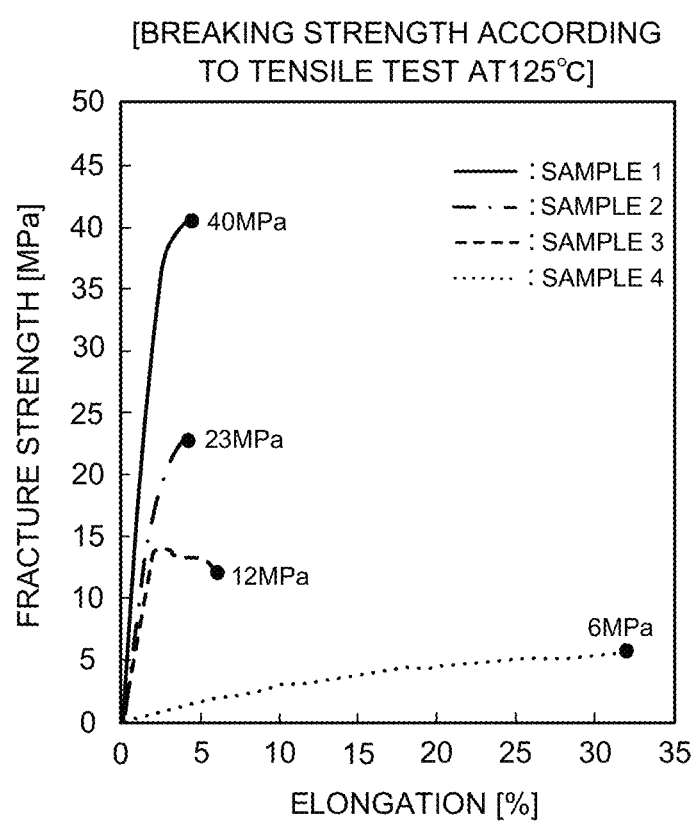
FIG. 3 is a chart illustrating tensile test results of resin-containing materials (samples 1, 2) as resin-containing layers of the embodiment and resin-containing materials (samples 3, 4) as comparative examples.
Figure 4:
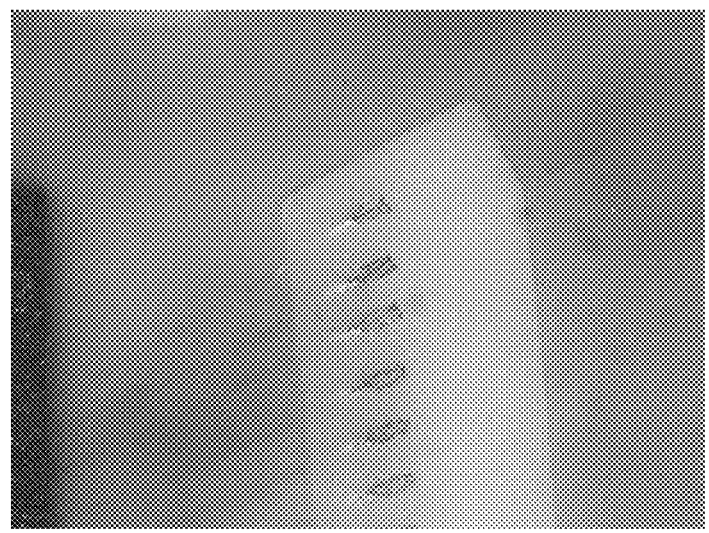
FIG. 4 is a view illustrating a state of a wiring board after a TCT test in 1000 cycles for a semiconductor device having the resin-containing layer composed of the sample 1.
Figure 5:
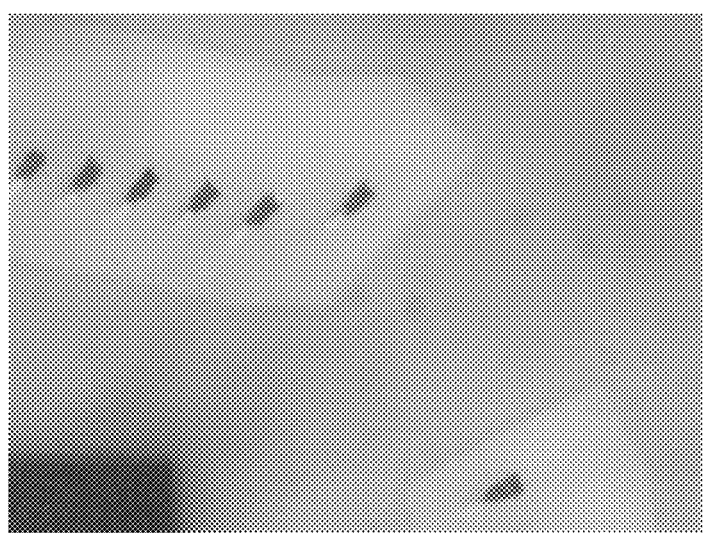
FIG. 5 is a view illustrating a state of a wiring board after the TCT test in 1000 cycles for a semiconductor device having the resin-containing layer composed of the sample 2.
Figure 6:
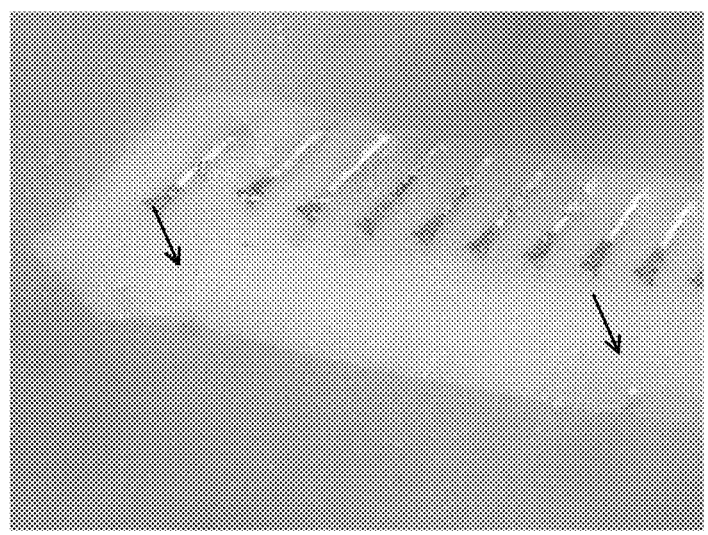
FIG. 6 is a view illustrating a state of a wiring board after the TCT test in 1000 cycles for a semiconductor device having the resin-containing layer composed of the sample 3.
Figure 7:
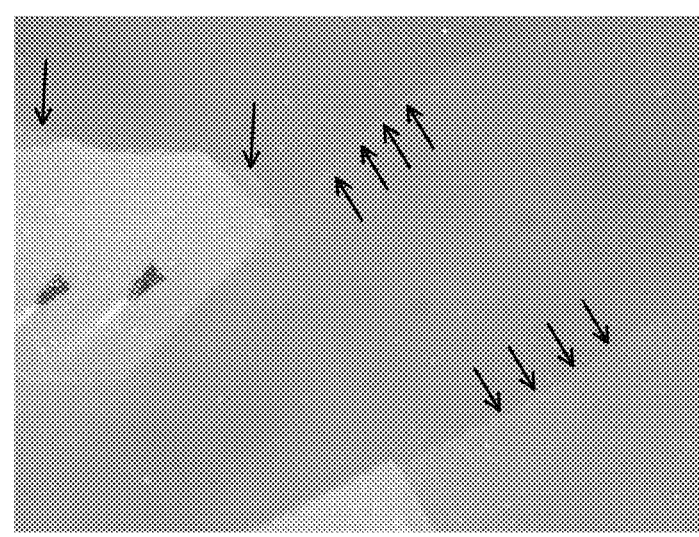
FIG. 7 is a view illustrating a state of a wiring board after the TCT test in 1000 cycles for a semiconductor device having the resin-containing layer composed of the sample 4.

A relationship between the breaking strength of the resin-containing layer 4 at 125° C. and the occurrence of the crack in the TCT for the semiconductor device 1 is concretely explained. Here, a cured product of a mixture composition containing an epoxy resin composition as a thermosetting resin, acrylic rubber as a high-molecular component for making the resin-containing layer 4 into a sheet shape, and silica (silicon oxide) particles as an inorganic filler (epoxy resin-acrylic rubber mixture composition (pre-cured composition)) is applied to the resin-containing layer 4. Note that the epoxy resin composition contains a phenolic resin as a curing agent. In preparing the epoxy resin-acrylic rubber mixture composition, by changing an epoxy equivalent of the epoxy resin, a hydroxyl equivalent of the phenolic resin as the curing agent, an equivalence ratio between the epoxy resin and the phenolic resin, a weight-average molecular weight of the acrylic rubber, a compounding ratio of the acrylic rubber, or the like, four samples having different breaking strengths at 125° C. were produced. A tensile test was carried out on cured products of a sample 1, a sample 2, a sample 3, and a sample 4, to measure fracture strengths with respect to elongation at 125° C. FIG. 3 illustrates measured results. The breaking strength mentioned here indicates the fracture strength in the tensile test at 125° C.

As illustrated in FIG. 3, the fracture strength (breaking strength) of the cured product of the sample 1 at 125° C. is 40 MPa, and the fracture strength (breaking strength) of the cured product of the sample 2 at 125° C. is 23 MPa. The cured products of these samples 1, 2 satisfy a condition in which the breaking strength at 125° C. is 15 MPa or more, and correspond to the resin-containing layers 4 (cured products of epoxy resin-acrylic rubber mixture compositions) in examples. On the other hand, the fracture strength (breaking strength) of the cured product of the sample 3 at 125° C. is 12 MPa, and the fracture strength (breaking strength) of the cured product of the sample 4 at 125° C. is 6 MPa. The cured products of these samples 3, 4 do not satisfy the condition in which the breaking strength at 125° C. is 15 MPa or more, and correspond to resin-containing layers (cured products of epoxy resin-acrylic rubber mixture compositions) in comparative examples with respect to the embodiment.

The semiconductor devices 1 (Example 1, Example 2, Comparative example 1, and Comparative example 2) illustrated in FIG. 1 were produced by using the above-described sample 1, sample 2, sample 3, and sample 4. The semiconductor devices 1 are the ones in each of which the first semiconductor chip 3 is fixed on the wiring board 2 while being embedded in the resin-containing layer 4, and the 16-stage second semiconductor chips 6 are mounted thereon, as described above. Moreover, the semiconductor device 1 (Example 3) was produced similarly by using a sample 5 having a fracture strength (breaking strength) of 15 MPa at 125° C. On these semiconductor devices in Examples 1 to 3 and Comparative examples 1 to 2, the TCT was carried out under the condition of −55° C.×15 minutes+ 125° C.×15 minutes. After carrying out the TCT in 700 cycles regarding each example, the presence/absence of the crack in the resin-containing layer 4 was evaluated. The one in which the crack in the resin-containing layer 4 did not occur was set as a good product, and the one in which the crack occurred was set as a defective product. Regarding each example, the TCT on 100 samples each was carried out to examine a defective percentage. Table 1 presents the results. Further, regarding the semiconductor devices in Examples 1 to 2 and Comparative examples 1 to 2, FIG. 4 to FIG. 7 illustrate representative examples of the wiring layers after the TCT in 1000 cycles.

TABLE 1

| | Resin-containing layer | Defective percentage (the number of defective products among 100 pieces) after TCT (700 cycles) |
|---|---|---|
| Example 1 | Sample 1 (fracture strength: 40 MPa) | 0%(0/100) |
| Example 2 | Sample 2 (fracture strength: 23 MPa) | 0%(0/100) |
| Example 3 | Sample 5 (fracture strength: 15 MPa) | 0%(0/100) |
| Comparative example 1 | Sample 3 (fracture strength: 12 MPa) | 1%(1/100) |
| Comparative example 2 | Sample 4 (fracture strength: 6 MPa) | 17%(17/100) |

As presented in Table 1, it is found that in any of the semiconductor devices 1 each having the resin-containing layer 4 composed of the resin-containing material having the breaking strength of 15 MPa or more at 125° C. (Examples 1 to 3), the crack in the resin-containing layer 4 does not occur even after the TCT in 700 cycles, and the defective percentage is 0%. This point is also obvious from plane pictures of wiring layers in FIG. 4 and FIG. 5, and the crack does not occur. On the other hand, it is found that in either of the semiconductor devices 1 each having the resin-containing layer composed of a resin-containing material having a breaking strength of less than 15 MPa at 125° C. (Comparative examples 1 to 2), the samples in each of which the crack in the resin-containing layer has occurred increase after the TCT in 700 cycles, and are inferior to the reliability. This point is also obvious from plane pictures of wiring layers in FIG. 6 and FIG. 7, and it is found that the cracks (in the drawings, indicated by arrows) occur in the resin-containing layers.

The more the number of second semiconductor chips 6 mounted on the resin-containing layer 4 is increased, the more likely the defect of the semiconductor device 1 after the TCT is to occur. For this reason, the embodiment is effective in the semiconductor device 1 having a large thickness based on the number of second semiconductor chips 6 mounted on the resin-containing layer 4. Concretely, when a thickness of the stack 7 of the second semiconductor chips 6 (a value obtained by adding a total of thicknesses of the semiconductor chips 6 and a total of thicknesses of the adhesion layers 13 used for bonding the semiconductor chips 6) is 67% or more with respect to a thickness of the semiconductor device 1, the semiconductor device 1 of the embodiment effectively functions, and can suppress the crack in the resin-containing layer 4 and a fracture of board wiring caused by the crack. Note that a case of mounting the stack 7 of the second semiconductor chips 6 on the resin-containing layer 4 embedded with the first semiconductor chip 3 has been explained in the first embodiment, but there is no limitation to this. For example, also in a case of mounting the stack 7 of the second semiconductor chips 6 on the wiring board 2, when a ratio of a thickness of the stack containing the second semiconductor chips 6 to a thickness of the semiconductor device 1 is 67% or more, an adhesion layer composed of the resin-containing material having the breaking strength of 15 MPa or more at 125° C. effectively functions.

As a resin composition used for formation of the resin-containing layer 4, there is used, for example, a thermosetting epoxy resin-containing composition, a polyimide resin-containing composition, an acrylic resin-containing composition, a phenolic resin-containing composition, or the like. Among these, the thermosetting epoxy resin-containing composition is suitably used. Concretely, a mixture composition containing an epoxy resin composition as a thermosetting resin, acrylic rubber as a high-molecular component, an inorganic filler such as silica particles, aluminum oxide particles, or zirconium oxide particles, and so on is suitable. Applying, for example, such conditions as indicated below to such a mixture composition allows the breaking strength of a cured product thereof at 125° C. to be 15 MPa or more. The mixture composition (resin composition) may contain a curing accelerator, various additives, a solvent, or the like used for a typical thermosetting adhesive other than the above-described components.

As the epoxy resin, a bisphenol-type epoxy resin, a phenol novolac-type epoxy resin, a cresol novolac-type epoxy resin, or the like can be used independently or in combination. Further, a generally known epoxy resin such as a polyfunctional epoxy resin, a heterocycle-containing epoxy resin, or an alicyclic epoxy resin may be used. An epoxy equivalent of the epoxy resin is preferably 150 to 2000 g/eq, and further, more preferably 150 to 1000 g/eq. Using the epoxy resin having a relatively low epoxy equivalent makes cross-linking with the curing agent dense, which makes it possible to increase the breaking strength of the cured product of the composition containing the epoxy resin.

As the curing agent for the epoxy resin, the phenolic resin can be used. As the phenolic resin, a novolac-type phenolic resin, a resol-type phenol resin, or the like can be used independently or in combination. A hydroxyl equivalent of the phenolic resin is preferably 90 to 220 g/eq, and further, more preferably 90 to 180 g/eq. Using the phenolic resin having a relatively low hydroxyl equivalent makes cross-linking with the epoxy resin dense, which makes it possible to increase the breaking strength of the cured product of the composition containing the epoxy resin. Moreover, an equivalence ratio between the epoxy resin and the phenolic resin (an equivalent of the epoxy resin/an equivalent of the phenolic resin) is preferably 0.8 to 1.2. Using the mixture having such an equivalence ratio allows redundant functional groups to be reduced in a reaction of epoxy groups of the epoxy resin and hydroxyl groups of the phenolic resin, thereby promising to improve the breaking strength of the cured product.

The resin composition can contain the acrylic rubber as the high-molecular component, for example. A weight-average molecular weight of the acrylic rubber is preferably five hundred thousand to one million, and further, more preferably six-hundred fifty thousand to one million. Using the acrylic rubber having a high molecular weight makes it possible to promise to entangle macromolecules with each other, which promises to improve the breaking strength. Further, the acrylic rubber preferably contains a crosslink-able functional group. As a functional monomer having the crosslinkable functional group, glycidyl acrylate, acrylic acid, or the like can be used. The acrylic rubber contains the crosslinkable functional group, thereby promising to cause a crosslinking reaction with the epoxy resin and the phenolic resin, and complex binding between the materials promises to improve the breaking strength.

Moreover, in the resin composition, a compounding ratio of the acrylic rubber as the high-molecular component is preferably 1 to 20 mass %. Setting the compounding ratio of the acrylic rubber to be relatively low causes a compounding ratio of the thermosetting epoxy resin and the phenolic resin to rise relatively, which promises to improve the breaking strength of the cured product of the composition thereof. Further, in the resin composition, differences in solubility parameters (SP values) between the respective components of the epoxy resin, the phenolic resin, and the acrylic rubber are preferably each less than 5.0, and further, more preferably less than 3.0. Close solubility parameters of the respective materials cause the complex binding between the materials to be formed, and this promises to improve the breaking strength.

The resin composition can contain an inorganic compound as the inorganic filler, for example. As the inorganic compound, the silica particles, the aluminum oxide particles, the zirconium oxide particles, or the like are used, but the inorganic compound other than these is applicable. In the resin composition, a content of the inorganic compound is preferably 30 to 65 mass %, and further, more preferably 35 to 60 mass %. Compounding the inorganic compound having such a content makes it possible to increase the breaking strength of the cured product (resin-containing product) of the resin composition.

In the cured product of the resin composition composing the resin-containing layer 4, it is preferable that the breaking strength at 125° C. is 15 MPa or more, in addition to which, the linear expansion coefficient is 70 ppm or less. This reduces a linear expansion coefficient difference between the resin-containing layer 4 and the first and second semiconductor chips 3, 6, and further, the crack in the resin-containing layer 4 is effectively suppressed. Moreover, in the resin-containing layer 4, an adhesive strength to the metallic material (wiring material) such as gold, the resin material (insulating material), and the like which are composing materials of the wiring board 2 is preferably 10 MPa or more. This allows the crack in the resin-containing layer 4 and the fracture of the board wiring based thereon to be more effectively suppressed.

The resin-containing layer 4 preferably has a thickness of not less than 40 µm nor more than 150 µm. When the thickness of the resin-containing layer 4 is less than 40 µm, the resin-containing material is more susceptible to the stress caused by the temperature difference in the TCT, and there is a possibility of reducing the resistance to the TCT. Further, the thickness of the resin-containing layer 4 exceeding 150 µm is disadvantageous to the miniaturization of the package size. This is because when a thickness of the sealing resin layer 8 is made smaller in order to achieve an equal package thickness, there is a fear of reduction in impact resistance of the package, in such a case.

Figure 8:
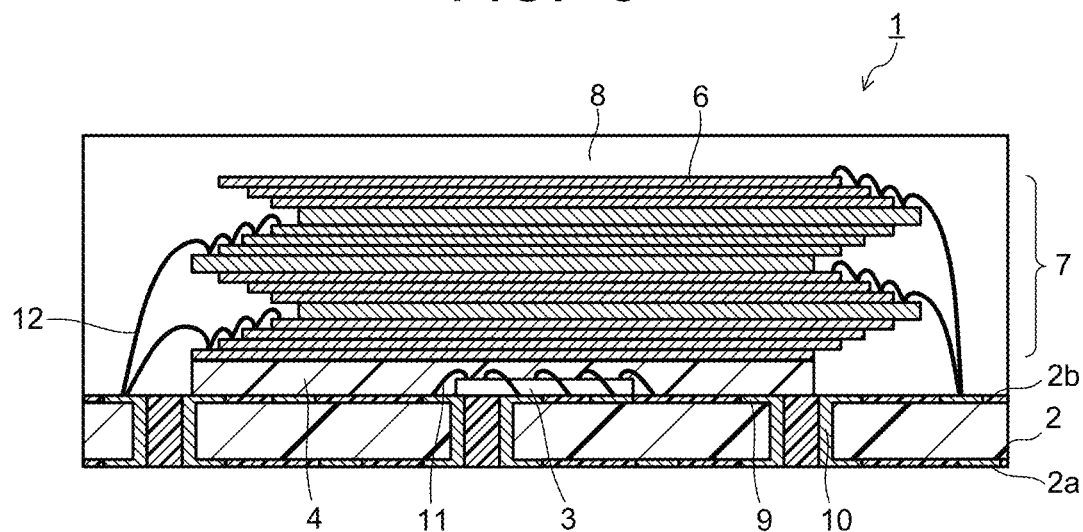
FIG. 8 is a sectional view illustrating a modified example of the semiconductor device according to the first embodiment.

FIG. 1 illustrates the semiconductor device 1 having the spacer chip 5 arranged between the resin-containing layer 4 and the stack 7 of the second semiconductor chips 6, but the semiconductor device 1 according to the first embodiment is no limitation to this. A sectional view of a modified example of the semiconductor device 1 according to the first embodiment is illustrated in FIG. 8. The modified example of the semiconductor device 1 according to the first embodiment does not include the spacer chip 5. In the semiconductor device 1 illustrated in FIG. 8, the second semiconductor chip 6 at the first stage in the stack 7 of the plurality of second semiconductor chips 6 is fixed on the resin-containing layer 4. The semiconductor device 1 according to the first embodiment may have such a constitution.

Second Embodiment

Figure 9:
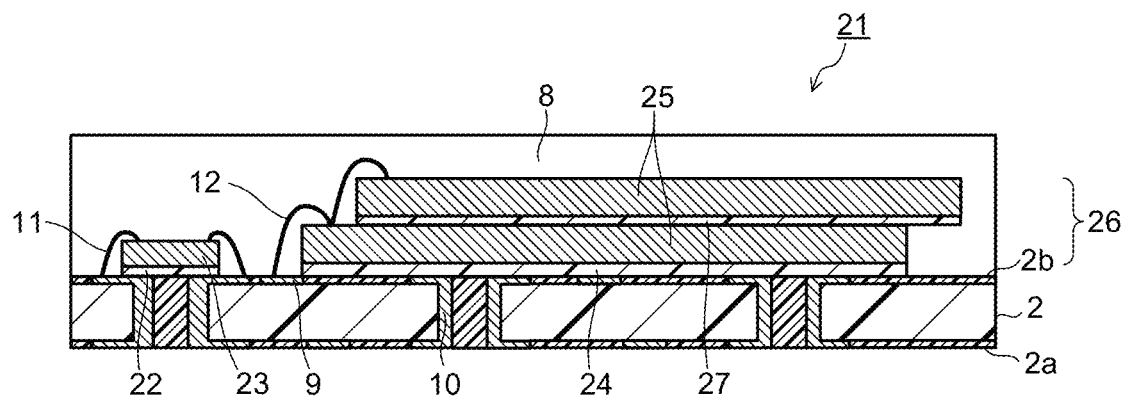
FIG. 9 is a sectional view illustrating a semiconductor device according to a second embodiment.

FIG. 9 is a sectional view illustrating a semiconductor device according to a second embodiment. A semiconductor device 21 illustrated in FIG. 9 includes a wiring board 2, a first semiconductor chip 23 fixed on the wiring board 2 with a first adhesion layer 22 interposed therebetween, a stack 26 of a plurality of second semiconductor chips 25 fixed on the wiring board 2 with second adhesion layers 24 interposed therebetween, and a sealing resin layer 8 provided on the wiring board 2 so as to seal the first semiconductor chip 23, the stack 26 of the second semiconductor chips 25, and the like. The wiring board 2 has a configuration similar to that of the first embodiment. In the stack 26 of the second semiconductor chips 25, the chip on the lower side is a first chip, and the chip on the upper side is a second chip.

As the first semiconductor chip 23, similarly to that of the first embodiment, there can be cited a system LSI chip such as a controller chip, an interface chip, a logic chip, or an RF chip which transmits and receives digital signals between semiconductor memory chips used as the second semiconductor chips 25 and an external device, but there is no limitation to this. The first semiconductor chip 23 has a thickness of, for example, about 80 µm. Such a first semiconductor chip 23 is fixed to the wiring board 2 by the first adhesion layer 22. In the semiconductor device 21 of the second embodiment, a typical DAF material is used for the first adhesion layer 22. Electrodes (not illustrated) of the first semiconductor chip 23 are electrically connected to wiring layers 9 of the wiring board 2 via bonding wires 11.

As the second semiconductor chip 25, similarly to that of the first embodiment, a semiconductor memory chip such as a NAND-type flash memory can be cited, but there is no limitation to this. In the second embodiment, the two second semiconductor chips 25 are stacked and mounted on the wiring board 2. The two second semiconductor chips 25 each have a thickness of about 250 µm. When the second semiconductor chips 25 each having such a thickness are stacked and mounted on the wiring board 2, the second semiconductor chip 25 on the lower side is bonded to the wiring board 2 by the second adhesion layer (first adhesive layer) 24 containing a resin-containing material having a breaking strength of 15 MPa or more at 125° C. The second adhesion layer (first adhesive layer) 24 is interposed between the wiring board 2 and the second semiconductor chip 25 on the lower side. For a third adhesion layer (second adhesive layer) 27 which bonds the second semiconductor chip 25 on the upper side to the second semiconductor chip 25 on the lower side, the typical DAF material may be used. In this case, the second adhesion layer 24 is equivalent to the resin-containing layer 4 in the first embodiment, and the third adhesion layer 27 is equivalent to the adhesion layer 13 in the first embodiment. As the third adhesion layer 27 interposed between the second semiconductor chip 25 on the lower side and the second semiconductor chip 25 on the upper side, the resin-containing material having a breaking strength of 15 MPa or more at 125° C. may be used similarly to the second adhesion layer 24.

The two second semiconductor chips 25 mounted on the wiring board 2 are stacked in a staircase shape by sliding end portions arranged with electrodes so as to expose the electrode of the second semiconductor chip 25 on the lower side. The electrodes (not illustrated) of the second semiconductor chips 25 are electrically connected to the wiring layer 9 of the wiring board 2 via bonding wires 12. Regarding electrode pads having equal electric property and signal property, the wiring layer 9 of the wiring board 2 and the electrode pads of the two second semiconductor chips 25 are connected in order via the bonding wires 12.

On a second face 2b of the wiring board 2, so as to seal the first semiconductor chip 23 and the stack 26 of the second semiconductor chips 25 together with the bonding wires 11, 12, the sealing resin layer 8 using an insulating resin such as an epoxy resin is, for example, mold-formed. The semiconductor device 21 of the second embodiment is constituted by these components. In such a semiconductor device 21, the first and second semiconductor chips 23, 25 each have a linear expansion coefficient of, for example, about 3 ppm. The wiring board 2 has a linear expansion coefficient of, for example, about 20 ppm. The sealing resin layer 8 has a linear expansion coefficient of, for example, about 10 ppm. The resin-containing material composing the second adhesion layer 24 has a linear expansion coefficient of, for example, about 70 ppm or less. Further, the semiconductor device 21 has a thickness of, for example, about 0.8 mm.

In addition to a difference in linear expansion coefficient between such constituent materials of the semiconductor device 21 as described above, in a case where a ratio of the stack 26 to a package thickness is high such that a total thickness of the two second semiconductor chips 25 is increased and a thickness of the stack 26 of the second semiconductor chips 25 (a value obtained by adding a total of thicknesses of the semiconductor chips 25 and a thickness of the third adhesion layer 27) is 67% or more with respect to a thickness of the semiconductor device 21, there is a fear of reduction in resistance of the semiconductor device 21 to a TCT. That is, due to the linear expansion coefficient difference between the wiring board 2 and the stack 26 of the second semiconductor chips 25, or the like, there is a possibility that a stress caused by a temperature difference in the TCT makes a crack likely to occur in the second adhesion layer 24. The stress concentrates at a tip of the crack which has occurred in the second adhesion layer 24, which causes rupture (wire break) in the wiring layer 9 coming into contact with the crack, resulting in causing defects.

Similarly to the above-described first embodiment, in order to suppress the crack in the second adhesion layer (first adhesive layer) 24 and the rupture (wire break) in the wiring layer 9 caused by the crack, in the semiconductor device 21 according to the second embodiment, the second adhesion layer 24 is composed of the resin-containing material having the breaking strength of 15 MPa or more at 125° C. Even when a thermal cycle having such a condition as described above is applied in, for example, 700 cycles, and further, 1000 cycles, the second adhesion layer 24 is composed of the resin-containing material having the breaking strength of 15 MPa or more at 125° C., thereby making it possible to suppress the occurrence of the crack to the second adhesion layer 24 based on the stress caused by the temperature difference, and further, the occurrence of the rupture (wire break) in the wiring layer 9 due to the stress concentration at the tip of the crack. That is, it becomes possible to enhance the reliability of the semiconductor device 21.

A concrete composition of the resin-containing material applied to the second adhesion layer 24 is similar to that of the first embodiment. That is, the resin-containing material as the second adhesion layer 24, in which a mixture composition containing an epoxy resin composition as a thermosetting resin, acrylic rubber as a high-molecular component, an inorganic filler such as silica particles, aluminum oxide particles, or zirconium oxide particles, and so on is used as an adhesive which fixes the second semiconductor chip 25 on the lower side to the wiring board 2, is formed by curing such an adhesive. The composition of the respective components of the mixture composition (resin composition) as the resin-containing material, a compounding ratio of the respective components, and the like are also similar to those of the first embodiment. Moreover, in the second adhesion layer 24, similarly to the first embodiment, a linear expansion coefficient is preferably 70 ppm or less, and an adhesive strength to the metallic material (wiring material) such as gold, the resin material (insulating material), and the like which are composing materials of the wiring board 2 is preferably 10 MPa or more. A thickness of the adhesion layer 24 is preferably not less than 40 µm nor more than 150 µm.

While certain embodiments have been described, these embodiments have been presented by way of example only, and are not intended to limit the scope of the inventions. Indeed, these embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a wiring board;
a first semiconductor chip mounted on the wiring board;
a resin-containing layer provided on the wiring board so as to embed the first semiconductor chip;
a plurality of second semiconductor chips stacked and mounted above the first semiconductor chip; and
a sealing resin layer provided on the wiring board so as to seal the first semiconductor chip and the plurality of second semiconductor chips, wherein
the resin-containing layer contains a resin-containing material having a breaking strength of 15 MPa or more at 125° C., and
a thickness of a stack formed of the plurality of second semiconductor chips is 67% or more of a thickness of an upper surface of the sealing resin layer to an under surface of the wiring board.

2. The device according to claim 1, wherein
a linear expansion coefficient of the resin-containing material is 70 ppm/° C. or less.

3. The device according to claim 1, wherein
an adhesive strength of the resin-containing material to composing materials of the wiring board is 10 MPa or more.

4. The device according to claim 1, wherein
a thickness of the resin-containing layer is not less than 40 µm nor more than 150 µm.

5. The device according to claim 1, wherein
the resin-containing material is a cured product of a resin composition containing an epoxy resin, a phenolic resin, acrylic rubber, and an inorganic filler.

6. The device according to claim 5, wherein
an epoxy equivalent of the epoxy resin is not less than 150 g/eq nor more than 2000 g/eq, and a hydroxyl equivalent of the phenolic resin is not less than 90 g/eq nor more than 220 g/eq, and
a ratio of the epoxy equivalent of the epoxy resin to the hydroxyl equivalent of the phenolic resin is not less than 0.8 nor more than 1.2.

7. The device according to claim 5, wherein
a weight-average molecular weight of the acrylic rubber is not less than 500000 nor more than 1000000, and
a compounding ratio of the acrylic rubber in the resin composition is not less than 1 mass % nor more than 20 mass %.

8. The device according to claim 1, further comprising
a spacer chip interposed between the resin-containing layer and the plurality of second semiconductor chips, wherein
a thickness of the spacer chip is added to the thickness of the stack.

* * * * *